United States Patent
Li

(10) Patent No.: US 10,490,126 B2
(45) Date of Patent: Nov. 26, 2019

(54) PIXEL COMPENSATION CIRCUIT

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xue Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 198 days.

(21) Appl. No.: 15/578,257

(22) PCT Filed: Nov. 29, 2017

(86) PCT No.: PCT/CN2017/113614
§ 371 (c)(1),
(2) Date: Nov. 30, 2017

(87) PCT Pub. No.: WO2019/019503
PCT Pub. Date: Jan. 31, 2019

(65) Prior Publication Data
US 2019/0035330 A1 Jan. 31, 2019

(30) Foreign Application Priority Data
Jul. 25, 2017 (CN) .......................... 2017 1 0609595

(51) Int. Cl.
G09G 3/3233 (2016.01)
G09G 3/3258 (2016.01)
G09G 3/3291 (2016.01)
H01L 27/32 (2006.01)
G09G 3/3266 (2016.01)

(52) U.S. Cl.
CPC ......... *G09G 3/3233* (2013.01); *G09G 3/3258* (2013.01); *G09G 3/3266* (2013.01); *G09G 3/3291* (2013.01); *H01L 27/3276* (2013.01); G09G 2300/043 (2013.01); G09G 2300/0814 (2013.01); G09G 2300/0819 (2013.01); G09G 2300/0842 (2013.01); G09G 2300/0861 (2013.01); G09G 2300/0866 (2013.01); G09G 2310/0262 (2013.01); G09G 2310/061 (2013.01); G09G 2310/08 (2013.01); G09G 2320/045 (2013.01)

(58) Field of Classification Search
None
See application file for complete search history.

(56) References Cited

U.S. PATENT DOCUMENTS

2016/0063922 A1  3/2016  Tsai et al.
2017/0061876 A1  3/2017  Cho et al.

FOREIGN PATENT DOCUMENTS

| CN | 105632408 A | 6/2016 |
|---|---|---|
| CN | 106486060 A | 3/2017 |
| CN | 106486063 A | 3/2017 |
| CN | 106935201 A | 7/2017 |

*Primary Examiner* — Gustavo Polo
(74) *Attorney, Agent, or Firm* — Mark M. Friedman

(57) ABSTRACT

A pixel compensation circuit is provided, and includes a first transistor, a second transistor, a third transistor, a fourth transistor, a fifth transistor, a sixth transistor, a seventh transistor, a storage capacitor, and a light emitting device.

18 Claims, 3 Drawing Sheets

PIXEL COMPENSATION CIRCUIT

FIELD OF THE INVENTION

The present disclosure relates to a technical field of displays, and particularly to a pixel compensation circuit.

BACKGROUND OF THE INVENTION

Organic light emitting diodes (OLED) have advantages such as having a wide color gamut, having a high contrast, energy saving, and having a foldable type of body. Thus, OLEDs have strong competitiveness in the market of conventional display devices. However, because luminous brightness of the OLED is related to current flowing through the OLED, electrical performance of a transistor as a driver will directly affect display. In particular, a threshold voltage of the transistor often drifts. Therefore, brightness of the entire OLED display device becomes uneven. In addition, when length of a pixel power line increases, a power supply voltage used to drive the OLED will cause a larger voltage drop and also cause uneven brightness of the OLED.

Therefore, it is necessary to provide a pixel compensation circuit and a display device to solve problems existing in the prior art.

SUMMARY OF THE INVENTION

An object of the present disclosure is to provide a pixel compensation circuit, which can eliminate poor screen display caused by voltage drops of threshold voltages of transistors and a power supply voltage, thereby improving screen display contrast and delaying aging of light emitting devices.

A pixel compensation circuit is provided, and includes a first transistor, a second transistor, a third transistor, a fourth transistor, a fifth transistor, a sixth transistor, a seventh transistor, a storage capacitor, and a light emitting device;
wherein a gate of the first transistor is electrically connected to a first control signal terminal, a source of the first transistor is electrically connected to a reference voltage terminal and a source of the third transistor, a drain of the first transistor is electrically connected to a first terminal of the storage capacitor and a source of the fifth transistor;
wherein a gate of the second transistor is electrically connected to the first control signal terminal, a source of the second transistor is electrically connected to a data voltage terminal, a drain of the second transistor is electrically connected to a drain of the fifth transistor and a gate of the seventh transistor;
wherein a gate of the third transistor is electrically connected to the first control signal terminal, a drain of the third transistor is electrically connected to a source of the sixth transistor and a drain of the seventh transistor;
wherein a gate of the fourth transistor is electrically connected to a second control signal terminal, a source of the fourth transistor is electrically connected to a first voltage terminal, a drain of the fourth transistor is electrically connected to a second terminal of the storage capacitor and a source of the seventh transistor;
wherein a gate of the fifth transistor is electrically connected to a third control signal terminal;
wherein a gate of the sixth transistor is electrically connected to a fourth control signal terminal, a drain of the sixth transistor is electrically connected to an anode of the light emitting device;
wherein a cathode of the light emitting device is electrically connected to a second voltage terminal;
wherein light emitting current flowing through the light emitting device is independent of a threshold voltage of a thin film transistor and a first voltage outputted from the first voltage terminal; and
wherein a combination of a first control signal outputted from the first control signal terminal, a second control signal outputted from the second control signal terminal, a third control signal outputted from the third control signal terminal, and a fourth control signal outputted from the fourth control signal terminal corresponds to a reset phase, a compensation phase, a coupling phase, and a light emitting phase in sequence.

In the pixel compensation circuit, the first transistor, the second transistor, the third transistor, the fourth transistor, the fifth transistor, the sixth transistor, and the seventh transistor are P-type transistors.

In the pixel compensation circuit, the first transistor, the second transistor, and the third transistor are N-type transistors while the fourth transistor, the fifth transistor, the sixth transistor, and the seventh transistor are P-type transistors.

In the pixel compensation circuit, the first control signal terminal is electrically connected to the third control signal terminal.

In the pixel compensation circuit, during the reset phase, the first transistor, the second transistor, the third transistor, and the fourth transistor are in a conducting state while the fifth transistor and the sixth transistor are in an off state.

In the pixel compensation circuit, during the compensation phase, the first transistor, the second transistor, and the third transistor are in a conducting state while the fourth transistor, the fifth transistor, and the sixth transistor are in an off state.

In the pixel compensation circuit, during the coupling phase, the fourth transistor and the fifth transistor are in a conducting state while the first transistor, the second transistor, the third transistor, and the sixth transistor are in an off state.

In the pixel compensation circuit, during the light emitting phase, the fourth transistor, the fifth transistor, and the sixth transistor are in a conducting state while the first transistor, the second transistor, and the third transistor are in an off state.

A pixel compensation circuit is also provided, and comprises: a first transistor, a second transistor, a third transistor, a fourth transistor, a fifth transistor, a sixth transistor, a seventh transistor, a storage capacitor, and a light emitting device;
wherein a gate of the first transistor is electrically connected to a first control signal terminal, a source of the first transistor is electrically connected to a reference voltage terminal and a source of the third transistor, a drain of the first transistor is electrically connected to a first terminal of the storage capacitor and a source of the fifth transistor;
wherein a gate of the second transistor is electrically connected to the first control signal terminal, a source of the second transistor is electrically connected to a data voltage terminal, a drain of the second transistor is electrically connected to a drain of the fifth transistor and a gate of the seventh transistor;
wherein a gate of the third transistor is electrically connected to the first control signal terminal, a drain of the third transistor is electrically connected to a source of the sixth transistor and a drain of the seventh transistor;

wherein a gate of the fourth transistor is electrically connected to a second control signal terminal, a source of the fourth transistor is electrically connected to a first voltage terminal, a drain of the fourth transistor is electrically connected to a second of the storage capacitor and a source of the seventh transistor;

wherein a gate of the fifth transistor is electrically connected to a third control signal terminal;

wherein a gate of the sixth transistor is electrically connected to a fourth control signal terminal, a drain of the sixth transistor is electrically connected to an anode of the light emitting device; and wherein a cathode of the light emitting device is electrically connected to a second voltage terminal.

In the pixel compensation circuit, the first transistor, the second transistor, the third transistor, the fourth transistor, the fifth transistor, the sixth transistor, and the seventh transistor are P-type transistors.

In the pixel compensation circuit, the first transistor, the first transistor, the second transistor, and the third transistor are N-type transistors while the fourth transistor, the fifth transistor, the sixth transistor, and the seventh transistor are P-type transistors.

In the pixel compensation circuit, the first control signal terminal is electrically connected to the third control signal terminal.

In the pixel compensation circuit, light emitting current flowing through the light emitting device is independent of a threshold voltage of a thin film transistor and a first voltage outputted from the first voltage terminal.

In the pixel compensation circuit, a combination of a first control signal outputted from the first control signal terminal, a second control signal outputted from the second control signal terminal, a third control signal outputted from the third control signal terminal, and a fourth control signal outputted from the fourth control signal terminal corresponds to a reset phase, a compensation phase, a coupling phase, and a light emitting phase in sequence.

In the pixel compensation circuit, during the reset phase, the first transistor, the second transistor, the third transistor, and the fourth transistor are in a conducting state while the fifth transistor and the sixth transistor are in an off state.

In the pixel compensation circuit, during the compensation phase, the first transistor, the second transistor, and the third transistor are in a conducting state while the fourth transistor, the fifth transistor, and the sixth transistor are in an off state.

In the pixel compensation circuit, during the coupling phase, the fourth transistor and the fifth transistor are in a conducting state while the first transistor, the second transistor, the third transistor, and the sixth transistor are in an off state.

In the pixel compensation circuit, during the light emitting phase, the fourth transistor, the fifth transistor, and the sixth transistor are in a conducting state while the first transistor, the second transistor, and the third transistor are in an off state.

The pixel compensation circuit of the present disclosure, which operates to first charge the storage capacitor during the reset phase, then discharge the storage capacitor during the compensation phase and capture the threshold voltage of the seventh transistor, and then transmit a power supply voltage outputted from a power supply voltage terminal to the second terminal of the storage capacitor through a capacitive coupling effect during the capacitive coupling phase, and then the power supply voltage can be eliminated during the light emitting phase. Thus, poor display screen caused by voltage drops of threshold voltage of transistors and a power supply voltage can be eliminated, thereby improving a screen display contrast and delaying aging of light emitting devices.

In order to that the foregoing description of the present disclosure becomes more clear, the preferred embodiments are given hereafter and are to be described in detail with reference to the accompanying drawings.

BRIEF DESCRIPTION OF THE DRAWINGS

The technical aspects of the present disclosure and other advantageous effects will be apparent from the following detailed description of specific embodiments of the present disclosure taken in conjunction with the accompanying drawings.

DETAILED DESCRIPTION OF THE PREFERRED EMBODIMENTS

In order to make the purpose, technical scheme and advantages of the present disclosure more clearly understood, the present disclosure is described in detail in combination with the drawings and embodiments. It is to be understood that the specific embodiments described herein are merely illustrative of the present disclosure and are not intended to limit the present disclosure.

Figure 1:
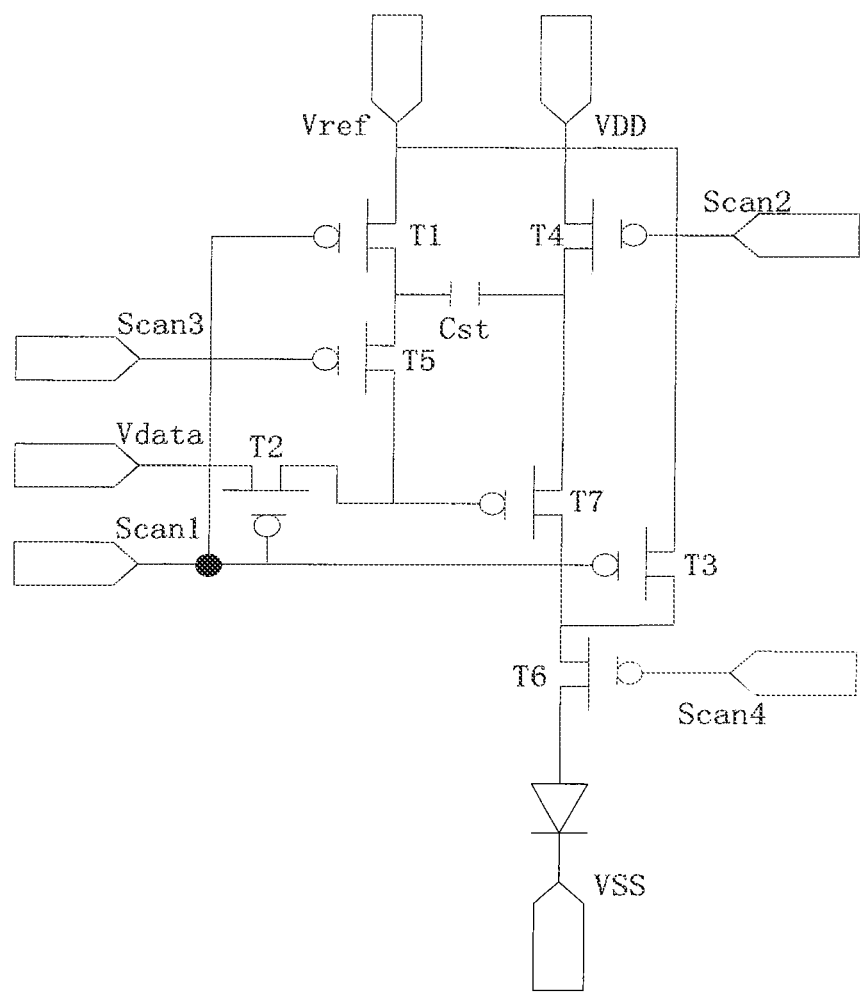
FIG. 1 is an illustration of a pixel compensation circuit provided in a first preferred embodiment of the present disclosure.

Refer to FIG. 1, which is an illustration of a pixel compensation circuit provided in a first preferred embodiment of the present disclosure. As shown in FIG. 1, the pixel compensation circuit provided in the first preferred embodiment of the present disclosure includes a first transistor T1, a second transistor T2, a third transistor T3, a fourth transistor T4, a fifth transistor T5, a sixth transistor T6, a seventh transistor T7, a storage capacitor Cst, and a light emitting device OLED.

It should be noted that this preferred embodiment has a first control signal terminal configured to output a first control signal Scan1, a second control signal terminal configured to output a second control signal Scan2, a third control signal terminal configured to output a third control signal Scan3, a fourth control signal terminal configured to output a fourth control signal Scan4, a data voltage terminal configured to output a data voltage Vdata, a reference voltage terminal configured to output a reference voltage Vref, a first voltage terminal configured to output a first voltage VDD, and a second voltage terminal configured to output a second voltage VSS.

Specifically, a gate of the first transistor T1 is electrically connected to the first control signal terminal, a source of the first transistor is electrically connected to the reference voltage terminal and a source of the third transistor T3, a drain of the first transistor. T1 is electrically connected to a first terminal of the storage capacitor Cst and a source of the fifth transistor T5;

a gate of the second transistor T2 is electrically connected to the first control signal terminal, a source of the second transistor T2 is electrically connected to the data voltage terminal, a drain of the second transistor T2 is electrically connected to a drain of the fifth transistor T5 and a gate of the seventh transistor T7;

a gate of the third transistor T3 is electrically connected to the first control signal terminal, a drain of the third transistor T3 is electrically connected to a source of the sixth transistor T6 and a drain of the seventh transistor T7;

a gate of the fourth transistor T4 is electrically connected to the second control signal terminal, a source of the fourth transistor T4 is electrically connected to the first voltage terminal, a drain of the fourth transistor T4 is electrically connected to a second terminal of the storage capacitor Cst and a source of the seventh transistor T7;

a gate of the fifth transistor T5 is electrically connected to the third control signal terminal;

a gate of the sixth transistor T6 is electrically connected to the fourth control signal terminal, a drain of the sixth transistor T6 is electrically connected to an anode of the light emitting device OLED; and a cathode of the light emitting device OLED is electrically connected to the second voltage terminal.

In this preferred embodiment, the first transistor T1 to the seventh transistor T7 are P-type transistors. This preferred embodiment is achieved to simplify manufacturing art and enhance efficiency by manufacturing the first transistor T1 to the seventh transistor T7 as the same type transistors.

Figure 2:
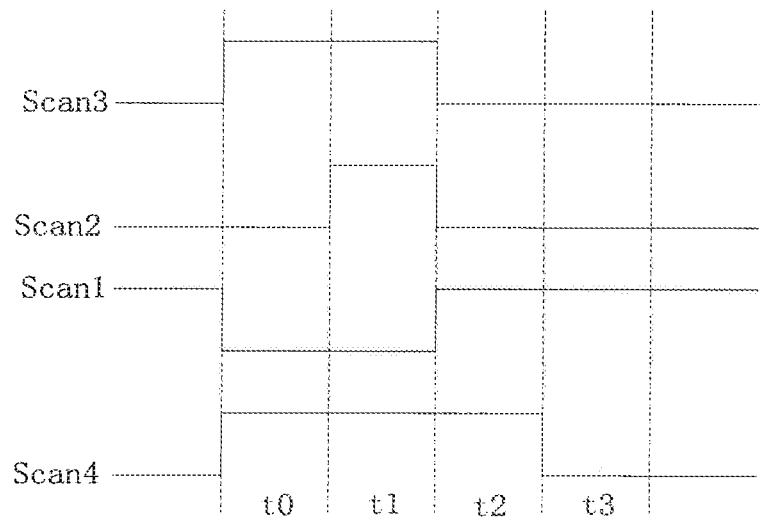
FIG. 2 is a timing diagram of the pixel compensation circuit provided in the first preferred embodiment of the present disclosure.

Subsequently, the process of driving the light emitting device OLED to emit light by the pixel compensation circuit as shown in FIG. 1 will be described in detail with reference to FIG. 2, which is a timing diagram of a pixel compensation circuit provided in the first preferred embodiment of the present disclosure. As shown in FIG. 2, an operation period of the pixel compensation circuit is divided into four phases, namely, a reset phase t0, a compensation phase t1, a coupling phase t2, and a light emitting phase t3. It should be noted that a combination of the first control signal Scan1, the second control signal Scan2, the third control signal Scan3, and the fourth control signal Scan4 corresponds to the reset phase t0, the compensation phase t1, the coupling phase t2 and the light emitting phase t3 in sequence.

During the reset phase t0, the first transistor T1 to the fourth transistor T4 are in an on state, and the fifth transistor T5 to the seventh transistor T7 are in an off state. Specifically, electric potentials of the third control signal Scan3 and the fourth control signal Scan4 are at a high level, while electric potentials of the first control signal Scan1 and of the second control signal Scan2 are at a low level. Such that the first transistor T1 to the fourth transistor T4 are turned on, the fifth transistor T5 and the sixth transistor T6 are turned off, the reference voltage Vref is transmitted to the first terminal of the storage capacitor Cst through the first transistor T1, and the first voltage VDD is transmitted to the second terminal of the storage capacitor Cst through the fourth transistor T4, while the data voltage Vdata is transmitted to the gate of the seventh transistor T7 through the second transistor T2, and the reference voltage Vref is transmitted to the drain of the seventh transistor T7 through the third transistor T3.

Subsequently, during the compensation phase t1, the first transistor T1 to the third transistor T3 are in an on state, and the fourth transistor T4 to the sixth transistor T6 are in an off state. Specifically, the electric potentials of the second control signal Scan2, the third control signal Scan3, and fourth control signal Scan4 are at a high level, while the electric potential of the first control control signal Scan1 is at a low level. Such that the first transistor T1 to the third transistor T3 are turned on, and the fourth transistor T4 to the sixth transistor T6 are turned off, so that the storage capacitor Cst, the first transistor T1, the third transistor T3, and the seventh transistor T7 are commonly formed into a discharge loop, until a electric potential of the second terminal of the storage capacitor Cst is equal to an electric potential of Vdata−Vth1 to cut-off the discharge loop, wherein the voltage Vth1 is a threshold voltage of the seventh transistor T7.

Then, during the coupling phase t2, the fourth transistor T4 and the fifth transistor T5 are in an on state, the first transistor T1 to the third transistor T3 and the sixth transistor T6 are in an off state. Specifically, the electric potentials of the first control signal Scan1 and the fourth control signal Scan4 are at a high level, while the electric potentials of the second control signal Scan2 and the third control signal Scan3 are at a low level. Such that the fourth transistor T4 and the fifth transistor T5 are turned on, the first transistor T1 to the third transistor T3 and the sixth transistor T6 are turned off, and the first voltage VDD is transmitted to the second of the storage capacitor Cst. So that the electric potential of the second terminal of the storage capacitor Cst changes in an instantaneous transition from the electric potential of the Vdata−Vth1 during the compensation phase t1 to the first voltage VDD during the coupling phase t2, thereby an electric potential of the first terminal of the storage capacitance Cst changing into an electric potential of Vref+VDD−Vdata−Vth1, at the same time, the fifth transistor T5 is turned on, and the electric potential of the first terminal of the storage capacitor Cst is transmitted to the gate of the seventh transistor T7, such that the electric potential of the gate of the seventh transistor T7 is the electric potential of Vref+VDD−Vdata−Vth1.

Finally, during the light emitting phase t3, the fourth transistor T4 to the sixth transistor T6 are in an on state, the first transistor T1 to the third transistor T3 are in an off state. Specifically, the electric potential of the first control signal Scan1 is at a high level, while the electric potentials of the second control signal Scan2, the third control signal Scan3, and the fourth control signal Scan4 are at a low level, such that the fourth transistor T4 to the sixth transistor T6 are turned on, the first transistor T1 to the third transistor T3 are turned off, and current flowing through the seventh transistor T7 satisfies the following function.

$$I = K(Vgs - 1Vth1)^2$$
$$= K(Vs - Vg - 1Vth1)^2$$
$$= K(VDD - Vref - VDD + Vdata + 1Vth1 - 1Vth1)^2$$
$$= K(Vdata - Vref)^2$$

From an observation of a calculation result of the function, the current flowing through the light emitting device OLED is only related to the data voltage Vdata and the reference voltage Vref, and is regardless of the threshold voltage Vth1 of the seventh transistor T7 and the power supply voltage VDD that is liable to generate a voltage drop.

The pixel compensation circuit of this preferred embodiment, which operates to first charge the storage capacitor during the reset phase, then discharge the storage capacitor during the compensation phase and captures the threshold voltage of the seventh transistor, and then transmit a power supply voltage outputted from a power supply voltage terminal to the second terminal of the storage capacitor through a capacitive coupling effect during the capacitive coupling phase, and then the power supply voltage can be eliminated during the light emitting phase. Thus, a poor screen display caused by voltage drops of threshold voltages of transistors and the power supply voltage can be eliminated, thereby improving a screen display contrast and delaying aging of light emitting devices.

Figure 3:
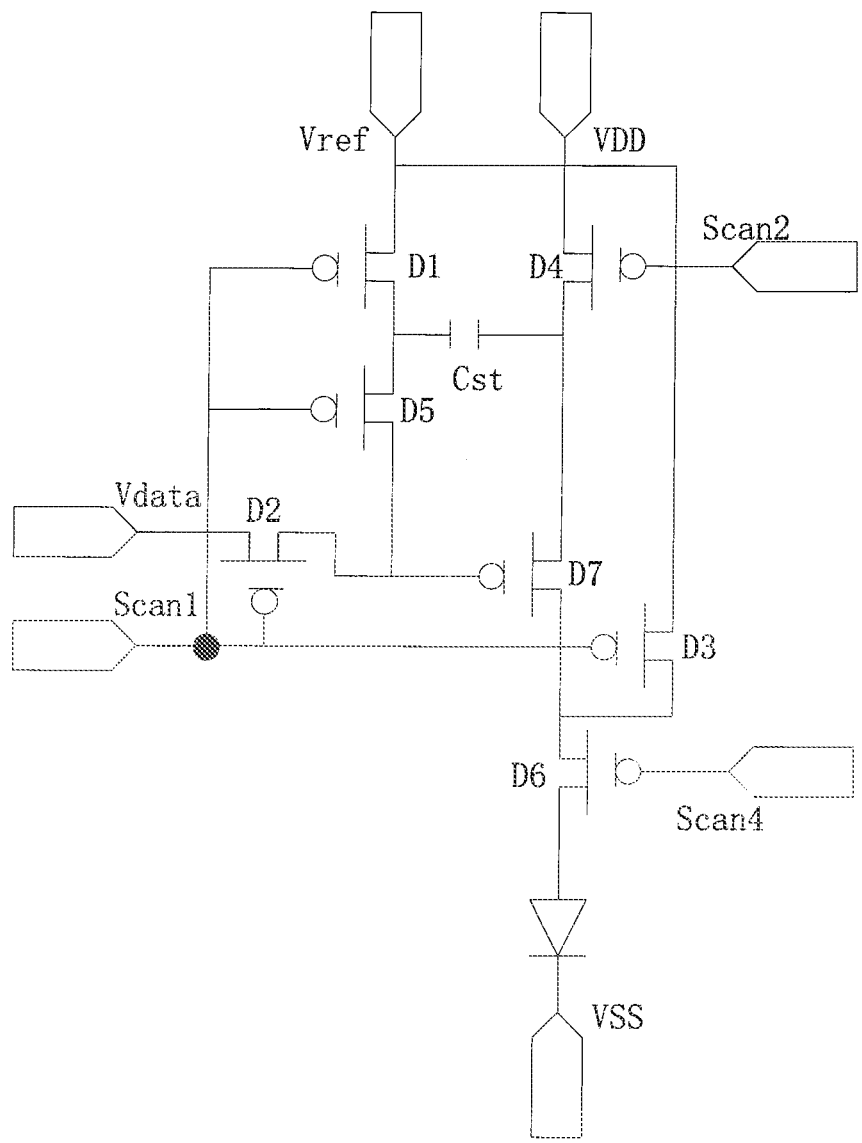
FIG. 3 is an illustration of a pixel compensation circuit provided in a second preferred embodiment of the present disclosure.

Refer to FIG. 3, which is an illustration of a pixel compensation circuit provided in a second preferred embodiment of the present disclosure. As shown in FIG. 3, the pixel compensation circuit provided in this preferred embodiment includes a first transistor D1, a second transistor D2, a transistor D3, a transistor D4, a transistor D5, a transistor D6, a transistor D7, a storage capacitor, and a light emitting device OLED.

It should be noted that this preferred embodiment has a first control signal terminal and a third control signal terminal both configured to output a first control signal Scan1, a second control signal terminal configured to output a second control signal Scan2, a fourth control signal terminal configured to output a fourth control signal Scan4, a data voltage terminal configured to output a data voltage Vdata, a reference voltage terminal configured to output a reference voltage Vref, a first voltage terminal configured to output a first voltage VDD, and a second voltage terminal configured to output a second voltage VSS.

Specifically, a gate of the first transistor D1 is electrically connected to the first control signal terminal, a source of the first transistor is electrically connected to the reference voltage terminal and a source of the third transistor T3, a drain of the first transistor D1 is electrically connected to a first terminal of the storage capacitor Cst and a source of the fifth transistor T5;

a gate of the second transistor D2 is electrically connected to the first control signal terminal, a source of the second transistor D2 is electrically connected to the data voltage terminal, a drain of the second transistor D2 is electrically connected to a drain of the fifth transistor D5 and a gate of the seventh transistor D7;

a gate of the third transistor D3 is electrically connected to the first control signal terminal, a drain of the third transistor D3 is electrically connected to a source of the sixth transistor D6 and a drain of the seventh transistor D7;

a gate of the fourth transistor D4 is electrically connected to the second control signal terminal, a source of the fourth transistor D4 is electrically connected to the first voltage terminal, a drain of the fourth transistor D4 is electrically connected to a second terminal of the storage capacitor Cst and a source of the seventh transistor D7;

a gate of the fifth transistor D5 is electrically connected to the third control signal terminal;

a gate of the sixth transistor D6 is electrically connected to the fourth control signal terminal, a drain of the sixth transistor D6 is electrically connected to an anode of the light emitting device OLED; and a cathode of the light emitting device OLED is electrically connected to the second voltage terminal, In this preferred embodiment, the first transistor D1 to the third transistor D3 are N-type transistors, the fourth transistor D4 to the seventh transistor D7 are P-type transistors, and the first control signal terminal is electrically connected to the third control signal terminal. Thus, number of control signals will be reduced and wiring space will be saved.

Figure 4:
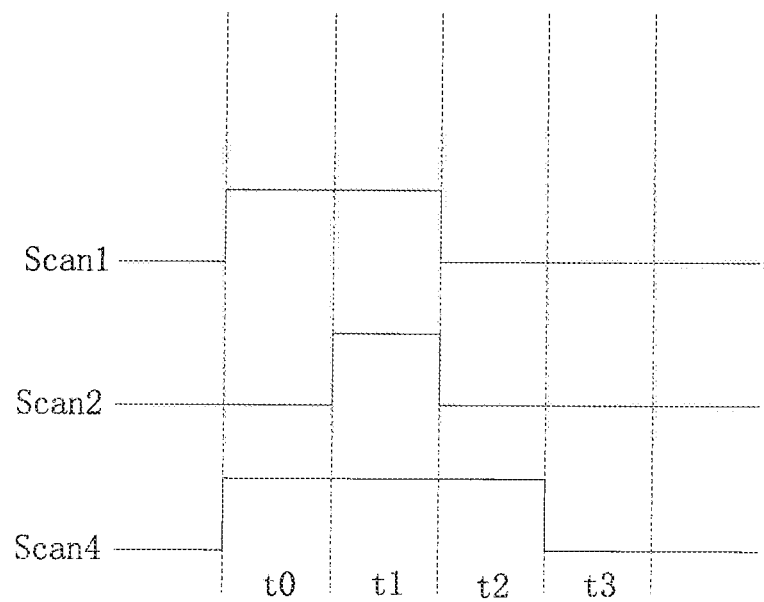
FIG. 4 is a timing diagram of the pixel compensation circuit provided in the second preferred embodiment of the present disclosure.

The process of driving the light emitting device OLED light emitted by the pixel compensation circuit shown in FIG. 3 will be described in detail with reference to FIG. 4, which is a timing diagram of a pixel compensation circuit provided in the second preferred embodiment of the present disclosure. As shown in FIG. 4, an operation period of the pixel compensation circuit is divided into four phases, namely, a reset phase t0, a compensation phase t1, a coupling phase t2, and a light emitting phase t3. It should be noted, that a combination of the first control signal Scan1, the second control signal Scan2, and the fourth control signal Scan4 corresponds to the reset phase t0, the compensation phase t1, the coupling phase t2, and the light emitting phase t3 in sequence.

During the reset phase t0, the first transistor D1 to the fourth transistor D4 are in an on state, and the fifth transistor D5 to the seventh transistor D7 are in an off state. Specifically, electric potentials of the first control signal Scan1 and the fourth control signal Scan4 are at a high level, while an electric potential of the second control signal is at a low level. Such that the first transistor D1 to the fourth transistor D4 are turned on, the fifth transistor D5 and the sixth transistor D6 are turned off, the reference voltage Vref is transmitted to the first terminal of the storage capacitor Cst through the first transistor D1, and the first voltage VDD is transmitted to the second terminal of the storage capacitor Cst through the fourth transistor D4, while the data voltage Vdata is transmitted to the gate of the seventh transistor D7 through the second transistor D2, and the reference voltage Vref is transmitted to the drain of the seventh transistor D7 through the third transistor D3.

Subsequently, during the compensation phase t1, the first transistor D1 to the third transistor D3 are in an on state, and the fourth transistor D4 to the sixth transistor D6 are in an off state. Specifically, the electric potentials of the first control signal Scan1, the second control signal Scan2 and the fourth control signal Scan4 are at a high level. Such that the first transistor D1 to the third transistor D3 are turned on, and the fourth transistor D4 to the sixth transistor D6 are turned off, so that the storage capacitor Cst, the first transistor D1, the third transistor D3, and the seventh transistor D7 are commonly formed into a discharge loop, until a electric potential of the second terminal of the storage capacitor Cst is equal to an electric potential of Vdata−Vth1 to cut-off the discharge loop, wherein the voltage Vth1 is a threshold voltage of the seventh transistor D7.

Then, during the capacitance coupling phase t2, the fourth transistor D4 and the fifth transistor D5 are in an on state, the first transistor D1 to the third transistor D3 and the sixth transistor D6 are in an off state. Specifically, the electric potential of the fourth control signal Scan4 are at a high level, while the electric potentials of the first control signal Scan1 and the second control signal Scan2 are at a low level. Such that the fourth transistor D4 and the fifth transistor D5 are turned on, the first transistor D1 to the third transistor D3 and the sixth transistor D6 are turned off, and the first voltage VDD is transmitted to the second of the storage capacitor Cst. So that the electric potential of the second terminal of the storage capacitor Cst changes in an instantaneous transition from the electric potential of the Vdata−Vth1 during the compensation phase t1 to the first voltage VDD during the coupling phase t2, thereby an electric potential of the first terminal of the storage capacitance Cst changing into an electric potential of Vref+VDD−Vdata−Vth1, at the same time, the fifth transistor T5 is turned on, and the electric potential of the first terminal of the storage capacitor Cst is transmitted to the gate of the seventh transistor D7, such that the electric potential of the gate of the seventh transistor D7 is the electric potential of Vref+VDD−Vdata−Vth1.

Finally, during the light emitting phase t3, the fourth transistor D4 to the sixth transistor D6 are in an on state, the first transistor D1 to the third transistor D3 are in an off state. Specifically, the electric potentials of the first control signal Scan1, the second control signal Scan2, and the fourth control signal Scan4 are at a low level, such that the fourth transistor D4 to the sixth transistor D6 are turned on, the first transistor D1 to the third transistor D3 are turned off, and current flowing through the seventh transistor D7 satisfies the following function.

$$I = K(Vgs - 1Vth1)^2$$
$$= K(Vs - Vg - 1Vth1)^2$$
$$= K(VDD - Vref - VDD + Vdata + 1Vth1 - 1Vth1)^2$$
$$= K(Vdata - Vref)^2$$

From an observation of a calculation result of the function, the current flowing through the light emitting device OLED is only related to the data voltage Vdata and the reference voltage Vref, and is regardless of the threshold voltage Vth1 of the seventh transistor D7 and the power supply voltage VDD that is liable to generate a voltage drop.

The pixel compensation circuit of this preferred embodiment, which operates to first charge the storage capacitor during the reset phase, then discharge the storage capacitor during the compensation phase and captures the threshold voltage of the seventh transistor, and then transmit a power supply voltage outputted from a power supply voltage terminal to the second terminal of the storage capacitor through a capacitive coupling effect during the capacitive coupling phase, and then the power supply voltage can be eliminated during the light emitting phase. Thus, the poor screen display caused by voltage drops of threshold voltage of transistors and the power supply voltage can be eliminated, thereby improving a screen display contrast and delaying aging of light emitting devices.

While the present disclosure has been disclosed with reference to preferred embodiments, the above-described embodiments are not intended to limit the present disclosure, and a person having ordinary skill in the art will be able to make various changes and modifications without departing from the spirit and scope of the present disclosure, and thus the scope of the present disclosure is defined by the scope of the claims.

What is claimed is:

1. A pixel compensation circuit, comprising: a first transistor, a second transistor, a third transistor, a fourth transistor, a fifth transistor, a sixth transistor, a seventh transistor, a storage capacitor, and a light emitting device;
    wherein a gate of the first transistor is electrically connected to a first control signal terminal, a source of the first transistor is electrically connected to a reference voltage terminal and a source of the third transistor, a drain of the first transistor is electrically connected to a first terminal of the storage capacitor and a source of the fifth transistor;
    wherein a gate of the second transistor is electrically connected to the first control signal terminal, a source of the second transistor is electrically connected to a data voltage terminal, a drain of the second transistor is electrically connected to a drain of the fifth transistor and a gate of the seventh transistor;
    wherein a gate of the third transistor is electrically connected to the first control signal terminal, a drain of the third transistor is electrically connected to a source of the sixth transistor and a drain of the seventh transistor;
    wherein a gate of the fourth transistor is electrically connected to a second control signal terminal, a source of the fourth transistor is electrically connected to a first voltage terminal, a drain of the fourth transistor is electrically connected to a second terminal of the storage capacitor and a source of the seventh transistor;
    wherein a gate of the fifth transistor is electrically connected to a third control signal terminal;
    wherein a gate of the sixth transistor is electrically connected to a fourth control signal terminal, a drain of the sixth transistor is electrically connected to an anode of the light emitting device;
    wherein a cathode of the light emitting device is electrically connected to a second voltage terminal;
    wherein light emitting current flowing through the light emitting device is independent of a threshold voltage of a thin film transistor and a first voltage outputted from the first voltage terminal; and
    wherein a combination of a first control signal outputted from the first control signal terminal, a second control signal outputted from the second control signal terminal, a third control signal outputted from the third control signal terminal, and a fourth control signal outputted from the fourth control signal terminal corresponds to a reset phase, a compensation phase, a coupling phase, and a light emitting phase in sequence.

2. The pixel compensation circuit as claimed in claim 1, wherein the first transistor, the second transistor, the third transistor, the fourth transistor, the fifth transistor, the sixth transistor, and the seventh transistor are P-type transistors.

3. The pixel compensation circuit as claimed in claim 1, wherein the first transistor, the second transistor, and the third transistor are N-type transistors while the fourth transistor, the fifth transistor, the sixth transistor, and the seventh transistor are P-type transistors.

4. The pixel compensation circuit as claimed in claim 3, wherein the first control signal terminal is electrically connected to the third control signal terminal.

5. The pixel compensation circuit as claimed in claim 1, wherein during the reset phase, the first transistor, the second transistor, the third transistor, and the fourth transistor are in a conducting state while the fifth transistor and the sixth transistor are in an off state.

6. The pixel compensation circuit as claimed in claim 1, wherein during the compensation phase, the first transistor, the second transistor, and the third transistor are in a conducting state while the fourth transistor, the fifth transistor, and the sixth transistor are in an off state.

7. The pixel compensation circuit as claimed in claim 1, wherein during the coupling phase, the fourth transistor and the fifth transistor are in a conducting state while the first transistor, the second transistor, the third transistor, and the sixth transistor are in an off state.

8. The pixel compensation circuit as claimed in claim 1, wherein during the light emitting phase, the fourth transistor, the fifth transistor, and the sixth transistor are in a conducting state while the first transistor, the second transistor, and the third transistor are in an off state.

9. A pixel compensation circuit, comprising: a first transistor, a second transistor, a third transistor, a fourth transistor, a fifth transistor, a sixth transistor, a seventh transistor, a storage capacitor, and a light emitting device;

wherein a gate of the first transistor is electrically connected to a first control signal terminal, a source of the first transistor is electrically connected to a reference voltage terminal and a source of the third transistor, a drain of the first transistor is electrically connected to a first terminal of the storage capacitor and a source of the fifth transistor;

wherein a gate of the second transistor is electrically connected to the first control signal terminal, a source of the second transistor is electrically connected to a data voltage terminal, a drain of the second transistor is electrically connected to a drain of the fifth transistor and a gate of the seventh transistor;

wherein a gate of the third transistor is electrically connected to the first control signal terminal, a drain of the third transistor is electrically connected to a source of the sixth transistor and a drain of the seventh transistor;

wherein a gate of the fourth transistor is electrically connected to a second control signal terminal, a source of the fourth transistor is electrically connected to a first voltage terminal, a drain of the fourth transistor is electrically connected to a second of the storage capacitor and a source of the seventh transistor;

wherein a gate of the fifth transistor is electrically connected to a third control signal terminal;

wherein a gate of the sixth transistor is electrically connected to a fourth control signal terminal, a drain of the sixth transistor is electrically connected to an anode of the light emitting device; and wherein a cathode of the light emitting device is electrically connected to a second voltage terminal.

10. The pixel compensation circuit as claimed in claim 9, wherein the first transistor, the second transistor, the third transistor, the fourth transistor, the fifth transistor, the sixth transistor, and the seventh transistor are P-type transistors.

11. The pixel compensation circuit as claimed in claim 9, wherein the first transistor, the second transistor, and the third transistor are N-type transistors while the fourth transistor, the fifth transistor, the sixth transistor, and the seventh transistor are P-type transistors.

12. The pixel compensation circuit as claimed in claim 11, wherein the first control signal terminal is electrically connected to the third control signal terminal.

13. The pixel compensation circuit as claimed in claim 9, wherein light emitting current flowing through the light emitting device is independent of a threshold voltage of a thin film transistor and a first voltage outputted from the first voltage terminal.

14. The pixel compensation circuit as claimed in claim 9, wherein a combination of a first control signal outputted from the first control signal terminal, a second control signal outputted from the second control signal terminal, a third control signal outputted from the third control signal terminal, and a fourth control signal outputted from the fourth control signal terminal corresponds to a reset phase, a compensation phase, a coupling phase, and a light emitting phase in sequence.

15. The pixel compensation circuit as claimed in claim 14, wherein during the reset phase, the first transistor, the second transistor, the third transistor, and the fourth transistor are in a conducting state while the fifth transistor and the sixth transistor are in an off state.

16. The pixel compensation circuit as claimed in claim 14, wherein during the compensation phase, the first transistor, the second transistor, and the third transistor are in a conducting state while the fourth transistor, the fifth transistor, and the sixth transistor are in an off state.

17. The pixel compensation circuit as claimed in claim 14, wherein during the coupling phase, the fourth transistor and the fifth transistor are in a conducting state while the first transistor, the second transistor, the third transistor, and the sixth transistor are in an off state.

18. The pixel compensation circuit as claimed in claim 14, wherein during the light emitting phase, the fourth transistor, the fifth transistor, and the sixth transistor are in a conducting state while the first transistor, the second transistor, and the third transistor are in an off state.

* * * * *